(12) United States Patent
Qi et al.

(10) Patent No.: US 10,606,137 B2
(45) Date of Patent: Mar. 31, 2020

(54) COMPOSITION FOR BLACK MATRIX AND METHOD FOR PREPARING THE SAME, DISPLAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Pengyu Qi, Beijing (CN); Dong Wang, Beijing (CN); Yangchen Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/724,954

(22) Filed: Oct. 4, 2017

(65) Prior Publication Data
US 2018/0188621 A1    Jul. 5, 2018

(30) Foreign Application Priority Data
Jan. 3, 2017 (CN) .......................... 2017 1 0001229

(51) Int. Cl.
| | | |
|---|---|---|
| *G02F 1/1362* | (2006.01) | |
| *G03F 1/00* | (2012.01) | |
| *G02F 1/1335* | (2006.01) | |
| *G03F 7/00* | (2006.01) | |

(52) U.S. Cl.
CPC .. *G02F 1/136209* (2013.01); *G02F 1/133512* (2013.01); *G03F 7/00* (2013.01); *G02F 2202/022* (2013.01); *G02F 2202/04* (2013.01)

(58) Field of Classification Search
CPC .......... G02F 1/16209; G02F 2292/022; G02F 2202/04; G02B 5/23; G03F 1/00; H01L 31/0232
See application file for complete search history.

(56) References Cited

U.S. PATENT DOCUMENTS

| | | | |
|---|---|---|---|
| 8,820,909 B2* | 9/2014 | Sasada ................. | C09D 11/101 347/100 |
| 2009/0236509 A1* | 9/2009 | Maruyama ............ | G03F 7/0007 250/237 R |

FOREIGN PATENT DOCUMENTS

| | | | | |
|---|---|---|---|---|
| CN | 104710844 A | | 6/2015 | |
| JP | 2002249678 | * | 9/2002 | ............... C09C 1/56 |

OTHER PUBLICATIONS

The First Chinese Office Action dated Sep. 25, 2019; Appln. No. 201710001229.0.

* cited by examiner

*Primary Examiner* — Bijan Ahvazi

(57) ABSTRACT

Disclosed are a composition for a black matrix and a method for preparing the same, a display substrate, and a display device. The composition for a black matrix comprises an adhesive, a light-shielding material, a solvent, a first dye and a monomer, wherein the light-shielding material comprises light-shielding particles, and an electrically insulating material and a base material with which the light-shielding particles are coated sequentially; and the adhesive, the first dye and the light-shielding material are bonded by the monomer.

16 Claims, 3 Drawing Sheets

COMPOSITION FOR BLACK MATRIX AND METHOD FOR PREPARING THE SAME, DISPLAY SUBSTRATE AND DISPLAY DEVICE

TECHNICAL FIELD

Embodiments of the present disclosure relate to a composition for a black matrix and a method for preparing the same, a display substrate and a display device.

BACKGROUND

A black matrix on a color filter substrate and/or an array substrate plays an important role in a thin film transistor liquid crystal display (TFT-LCD). The black matrix can improve the contrast of the liquid crystal display and prevent the colors of different sub-pixels from mixing with each other. It can also be used to block and absorb incident light so as to avoid light on the active layer of the thin film transistor, thereby ensuring the excellent off-state characteristics of the thin film transistor. Besides, the black matrix can block the gap between the signal line and the pixel electrode on the array substrate to prevent light leakage and to avoid reduction of the image contrast.

Metal chromium is typically used to prepare a black matrix. However, metal chromium leads to serious environmental pollution, and the resources for metal chromium are quite limited. A black photoresist material can also be obtained by refining carbon black with a super-dispersant to replace metallic chromium as a material for preparing a black matrix. However, in order to meet the requirement for better display performance of the filter, there is an increasing need to develop a new black photoresist material and to optimize the formation thereof so as to form a black photoresist material with a narrow particle size distribution range, a small particle size and good stability.

SUMMARY

At least one embodiment of the present disclosure provides a composition for a black matrix, comprising: an adhesive, a light-shielding material, a solvent, a first dye and a monomer, wherein the light-shielding material comprises light-shielding particles, and an electrically insulating material and a base material with which the light-shielding particles are coated sequentially; and the adhesive, the first dye and the light-shielding material are bonded by the monomer.

A composition for a black matrix provided by an embodiment of the present disclosure comprises about 12 wt % to about 25 wt % of the adhesive, about 20 wt % to about 45 wt % of the light-shielding material, about 10 wt % to about 45 wt % of the solvent, about 5 wt % to about 10 wt % of the first dye, and about 5 wt % to about 10 wt % of the monomer.

A composition for a black matrix provided by an embodiment of the present disclosure further comprises a second dye dissolved in the solvent.

In a composition for a black matrix provided by an embodiment of the present disclosure, the light-shielding particles include at least one of carbon black particles or titanium black particles.

In a composition for a black matrix provided by an embodiment of the present disclosure, the electrically insulating material is an electrically insulating organic material which includes at least one of a phenolic resin, a melamine resin, a polyester resin, an epoxy resin, a diphenyl ether resin, a silicone resin, or an organofluorine resin.

In a composition for a black matrix provided by an embodiment of the present disclosure, the electrically insulating material is an electrically insulating inorganic material which includes at least one of aluminum nitride, silicon nitride, or silicon carbide.

In a composition for a black matrix provided by an embodiment of the present disclosure, the adhesive comprises at least one of an acrylic resin or a polyimide resin.

In a composition for a black matrix provided by an embodiment of the present disclosure, the solvent comprises at least one of propylene glycol methyl ether propionate, ethylene glycol monomethyl ether acetate, 1,2-propylene glycol methyl ether acetate, ethylene glycol diethyl ether, N-methyl-2-pyrrolidone, cyclohexanone, or N,N-dimethylformamide.

In a composition for a black matrix provided by an embodiment of the present disclosure, the monomer comprises at least one of trimethylolpropane triacrylate (TMPTA), tripropylene glycol diacrylate (TPGDA), 1,6-hexanediol diacrylate (HDDA), dipentaerythritol hexaacrylate (DPHA), dipentaeritritol pentaacrylate (DPPA) or pentaerythritol triacrylate (PETA).

At least one embodiment of the present disclosure provides a method for preparing a composition for a black matrix, comprising:

providing light-shielding particles;

coating the light-shielding particles with an electrically insulating material and a base material sequentially to form a light-shielding material;

dispersing the light-shielding material and an adhesive in a solvent to prepare a dispersion; and mixing a first dye and a monomer with the dispersion to form the composition for a black matrix;

wherein the adhesive, the first dye and the light-shielding material are bonded by the monomer.

A method for preparing a composition for a black matrix provided by an embodiment of the present disclosure further comprises dissolving a second dye in the solvent.

In a method for preparing a composition for a black matrix provided by an embodiment of the present disclosure, the light-shielding particles include carbon black particles and/or titanium black particles.

In a method for preparing a composition for a black matrix provided by an embodiment of the present disclosure, the monomer comprises at least one of trimethylolpropane triacrylate (TMPTA), tripropylene glycol diacrylate (TPGDA), 1,6-hexanediol diacrylate (HDDA), dipentaerythritol hexaacrylate (DPHA), dipentacritritol pentaacrylate (DPPA) or pentaerythritol triacrylate (PETA).

At least one embodiment of the present disclosure provides a display substrate comprising a black matrix prepared from any above-mentioned composition for a black matrix.

At least one embodiment of the present disclosure provides a display device comprising any above-mentioned display substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS

1—light-shielding particles; 2—electrically insulating material; 3—base material; 4—light-shielding material; 5—monomer; 6—adhesive; 7—first dye; 8—solvent; and 9—second dye.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude other elements or objects. The phrases "on," "under," "right," "left" and the like are only used to indicate relative position relationship, and when the position of the object which is described is changed, the relative position relationship may be changed accordingly.

Optical density (OD) is defined as the common logarithm of the ratio of the transmittance of incident light to that of transmitted light. OD=lg (incident light/transmitted light) or OD=lg (1/light transmittance), refers to the optical density absorbed by the object detected, and is also known as absorbance. Optical density is one of the important parameters for detecting the characteristics of a composition for a black matrix, where the greater the optical density, the better the performance of the composition for a black matrix.

At present, the process for making a composition for a black matrix comprises: mixing carbon black particles with a base material, grinding the carbon black particles and the base material to form uniformly mixed powder, and then coating the carbon black particles coated with the base material with an electrically insulating material so that the carbon black particles are isolated from each other to avoid electrical connection of the carbon black particles in contact with each other, thereby improving the impedance of the black matrix material.

Figure 1:
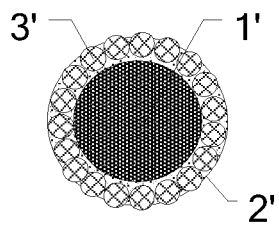
FIG. 1 is a schematic view of carbon black particles which are coated.

For example, FIG. 1 is a schematic view of carbon black particles which are coated. As shown in FIG. 1, the carbon black particles 1' are coated with a base material 2' and an electrically insulating material 3' sequentially. However, the composition for a black matrix prepared by the current method only widens the spacing between the carbon black particles; the particle size of the composite formed is increased by coating the carbon black particles with a base material; when the carbon black particles are coated with an electrically insulating material, the carbon black particles may not be fully covered with the electrically insulating material; after a long period of baking in the subsequent application of the composition, the impedance of the composition will be significantly reduced. In addition, as the spacing between the carbon black particles is widened, the amount of carbon black particles per unit volume is reduced; as a result, light easily penetrates through the gap between the carbon black particles, which significantly reduces the optical density of the black matrix material formed.

In view of the above-mentioned problems, at least one embodiment of the present disclosure provides a composition for a black matrix comprising: an adhesive, a light-shielding material, a solvent, a first dye and a monomer, wherein the light-shielding material comprises light-shielding particles, and an electrically insulating material and a base material with which the light-shielding particles are coated sequentially; and the adhesive, the first dye and the light-shielding material are bonded by the monomer.

The embodiments of the present disclosure improve the impedance and/or optical density of the composition for a black matrix by: (1) coating the light-shielding particles with an electrically insulating material and a base material sequentially to achieve better electrical insulation between the light-shielding particles, where the light-shielding particles have a smaller particle size prior to being coated with the electrically insulating material, making it easier to fully cover each of the light-shielding particles with the electrically insulating material; (2) the composition for a black matrix further comprises an adhesive, a monomer and a first dye, wherein the monomer has a long chain, widens the spacing between the light-shielding particles, and further enhances the impedance of the composition for a black matrix; the adhesive, the first dye and the light-shielding material are bonded by the monomer, thus better supporting the light-shielding material; the first dye can refract incident light and reduce light transmittance, thereby increasing the optical density.

The following description will be made with reference to several embodiments.

Embodiment 1

The present embodiment provides a composition for a black matrix, comprising: an adhesive, a light-shielding material, a solvent, a first dye and a monomer, the light-shielding material comprising light-shielding particles, and an electrically insulating material and a base material with which the light-shielding particles are coated sequentially; and the adhesive, the first dye and the light-shielding material being bonded by the monomer.

For example, the composition for a black matrix comprises about 12 wt % to about 25 wt % of the adhesive, about 20 wt % to about 45 wt % of the light-shielding material, about 10 wt % to about 45 wt % of the solvent, about 5 wt % to about 10 wt % of the first dye, and about 5 wt % to about 10 wt % of the monomer.

For example, the composition for a black matrix preferably comprises about 13 wt % to about 20 wt % of the adhesive, about 32 wt % to about 42 wt % of the light-shielding material, about 25 wt % to about 40 wt % of the solvent, about 6 wt % to about 8 wt % of the first dye, and about 6 wt % to about 8 wt % of the monomer.

For example, the composition for a black matrix may comprise about 14 wt % of the adhesive, about 34 wt % of the light-shielding material, about 38 wt % of the solvent, about 7 wt % of the first dye, and about 7 wt % of the monomer.

Figure 2:
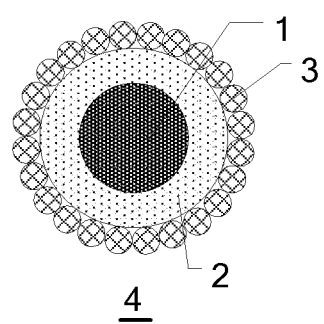
FIG. 2 is a schematic view of light-shielding particles which are coated according to an embodiment of the present disclosure.

For example, FIG. 2 is a schematic view of light-shielding particles which are coated according to the present embodiment. As shown in FIG. 2, the light-shielding particles 1 are coated with an electrically insulating material 2 and a base material 3 sequentially. The light-shielding particles 1 are coated firstly with the electrically insulating material 2 so that each of the light-shielding particles 1 can be fully covered with the electrically insulating material 2 and better electrical insulation can be achieved between the light-shielding particles 1, thereby improving the impedance of the composition for a black matrix. Moreover, the light-shielding particles 1 have a smaller particle size prior to being coated with the electrically insulating material 2, making it easier to fully cover each of the light-shielding particles 1 with the electrically insulating material.

For example, in the composition for a black matrix, the light-shielding particles 1 may be carbon black particles and/or titanium black particles (the main component is $TiN_xO_y$, where $0 \leq x \leq 2$, $1 \leq y \leq 2$, x and y being integers). Titanium black herein is also known as low valent titanium oxide or titanium oxynitride. For example, the light-shielding particles may also include other metal oxide particles such as ferroferric oxide particles and the like.

For example, the carbon black particles and the titanium black particles may have a particle size of about 200 to about 500 nm. For example, the carbon black particles and the titanium black particles may have a particle size of about 200 nm, 250 nm, 300 nm, 350 nm, 400 nm, 450 nm or 500 nm.

For example, the titanium black particles have a higher impedance than the carbon black particles. When the carbon black particles and the titanium black particles are mixed and used in the black matrix material, the impedance of the black matrix material can be controlled by adjusting the mass ratio of the carbon black particles to the titanium black particles. For example, in the mixed material formed from carbon black particles and titanium black particles, the mass of the carbon black particles is 5% to 20% of that of the titanium black particles. For example, the titanium black particles in the present embodiment can be obtained by reacting titanium dioxide powder with ammonia at about 800° C. to about 1000° C. for about 8 to 10 hours.

For example, in the composition for a black matrix, the electrically insulating material may be an electrically insulating organic material which includes at least one of a phenolic resin, a melamine resin, a polyester resin, an epoxy resin, a diphenyl ether resin, a silicone resin, or an organofluorine resin.

For example, when the surface of inorganic particles is coated with organics, the surface of inorganic particles can be coated uniformly and well, and the content of the organics with which the surface is coated has a great controllability.

For example, the structure formed in the present embodiment may be carbon black @ phenolic resin, carbon black @ melamine resin, carbon black @ polyester resin, carbon black @ epoxy resin, carbon black @ diphenyl ether resin, carbon black @ silicone resin, or carbon black @ organofluorine resin, etc. Or, the structure formed in the present embodiment may be titanium black @ phenolic resin, titanium black @ melamine resin, titanium black @ polyester resin, titanium black @ epoxy resin, titanium black @ diphenyl ether resin, titanium black @ silicone resin, or titanium black @ organofluorine resin, etc. It shall be noted that the structure of coating the surface of inorganic particles with organics in the present embodiment are not limited to the above, and it may also be a core-shell structure formed by carbon black/titanium black and the above various organics.

It shall be noted that A @ B mentioned above refers to the core-shell structure formed by A and B, where A is the core formed and B is the shell structure with which A is coated. The related expressions below also have the similar meaning, and no further detail will be provided.

For example, the method of coating the surface of inorganic particles with organics includes a graft polymerization process, an emulsion polymerization process or an emulsion crosslinking process.

Alternatively, in the composition for a black matrix, the electrically insulating material may be an electrically insulating inorganic material. For example, the electrically insulating inorganic material includes at least one of aluminum nitride, silicon nitride, or silicon carbide.

For example, the method of coating the surface of inorganic particles with inorganics includes a seed growth process or a solvothermal process. For example, when inorganic particles are coated with inorganics by a solvothermal process, it can be carried out in a high-pressure dynamic reaction kettle or in a high-pressure static reaction kettle.

For example, the structure of coating inorganic particles with inorganics in the present embodiment may be carbon black @ aluminum nitride, carbon black @ silicon nitride, carbon black @ silicon carbide, titanium black @ aluminum nitride, titanium black @ silicon nitride, or titanium black @ silicon carbide. It shall be noted that the structure of coating the surface of inorganic particles with inorganics in the present embodiment is not limited to the above, and it may also be a core-shell structure formed by carbon black/titanium black and the above various inorganics.

For example, the light-shielding particles and the electrically insulating material forming the above core-shell structure are dissolved in a corresponding solvent and subjected to ultrasonic dispersion. Then, some of the uniform dispersion obtained are dropped onto a copper wire having a carbon film, and dried naturally for being observed in a transmission electron microscope. It is found that the light-shielding particles 1 are uniformly coated with an electrically insulating material 2.

For example, after coating the surface of the light-shielding particles 1 with an electrically insulating material 2, the electrically insulating material 2 is further coated with a base material 3. For example, the base material 3 may be acrylic resin powder or polymethyl methacrylate (PMMA). The light-shielding particles 1 coated with the electrically insulating material 2 are mixed with acrylic resin powder or polymethyl methacrylate (PMMA), and the mixture is ground in a mortar to form a sesame ball-like structure. As shown in FIG. 2, a light-shielding material 4 having a three-layer structure is formed by coating the surface of the electrically insulating material 2 with acrylic resin or polymethyl methacrylate (PMMA). Obviously, the light-shielding material in the present embodiment is a composite structure formed by the light-shielding particles, the electrically insulating material and the base material.

For example, the light-shielding particles 1, the electrically insulating material 2 and the base material 3 forming the above-mentioned three-layer structure are dissolved in a corresponding solvent and subjected to ultrasonic dispersion. Then, some of the uniform dispersion obtained are dropped onto a copper wire having a carbon film and dried naturally for being observed in a transmission electron microscope, where it is found that the light-shielding particles 1 are uniformly coated with an electrically insulating material 2 which is coated with a base material 3. Afterwards, some of the uniform dispersion obtained are dropped onto a copper wire having a carbon film and dried naturally for being observed in a scanning electron microscope, where it is found that the surface of the electrically insulating material 2 is coated with the base material 3 to form a sesame ball.

For example, the light-shielding particles 1 are directly coated with an electrically insulating material 2, making it easier to fully coat each of the light-shielding particles 1 with the electrically insulating material 2. The base material 3 is applied on the outermost layer, making it easier to connect the light-shielding material 4 to a subsequent monomer.

For example, the content of the light-shielding material is controlled to be about 20 wt % to about 45 wt %. If the amount of the light-shielding material added is too small, the optical density will be reduced. If the amount of the light-shielding material added is too great, the relative amount of the adhesive will be too small, which may lead to poor adhesion.

Figure 3:
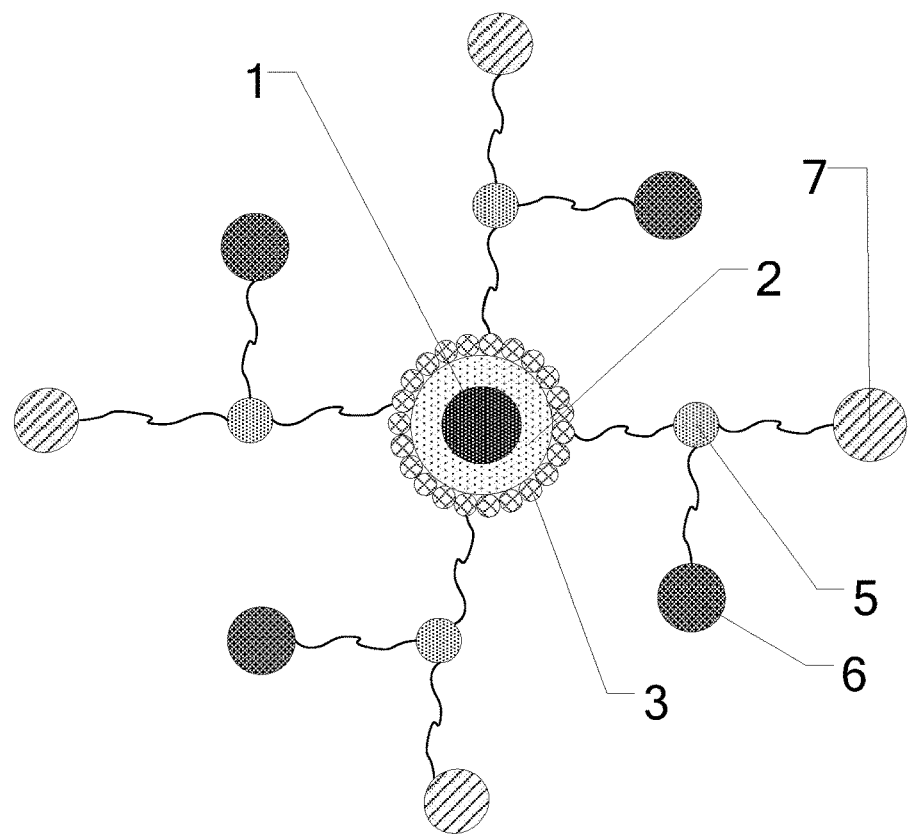
FIG. 3 is a diagram showing connection of the components in a composition for a black matrix according to an embodiment of the present disclosure.

For example, FIG. 3 is a schematic diagram showing the connection of the components in the composition for a black matrix according to the present embodiment. The composition for a black matrix further comprises a monomer 5, an adhesive 6, and a first dye 7, wherein the monomer 5 has a long chain and a branched chain, and the adhesive 6, the first dye 7 and the light-shielding material 4 are bonded by the monomer 5. The monomer 5 widens the spacing between the light-shielding particles 4 and thus further enhances the impedance of the black matrix material formed. The adhesive 6, the first dye 7 and the light-shielding material 4 are bonded by the monomer 5, thus better supporting the light-shielding material 4. The first dye 7 can refract incident light and reduce light transmittance, thereby increasing the optical density.

Figure 4:
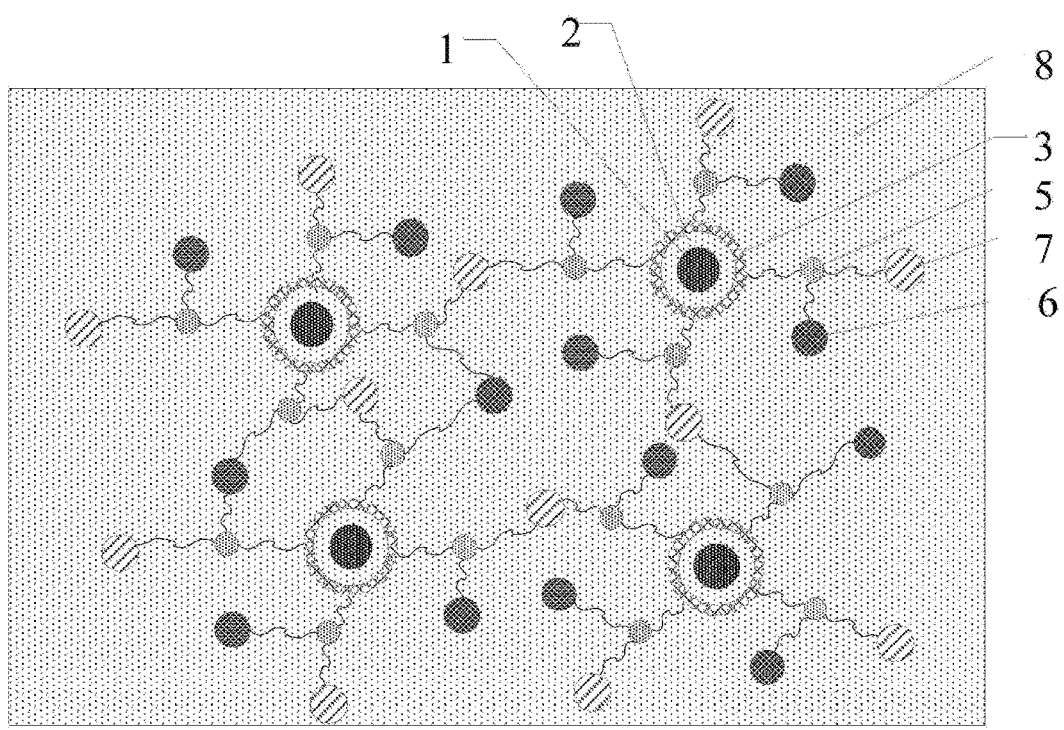
FIG. 4 shows a composition for a black matrix according to an embodiment of the present disclosure.

For example, FIG. 4 shows a composition for a black matrix provided by the present embodiment. The composition for a black matrix comprises, in addition to the components as shown in FIG. 3, a solvent 8 in which the monomer 5, the adhesive 6, the first dye 7 and the light-shielding material 4 are uniformly distributed.

For example, in the composition for a black matrix, the adhesive 6 comprises at least one of an acrylic resin or a polyimide resin.

For example, the adhesive chosen is an acrylic resin. Since an acrylic resin has excellent heat resistance and stability, it can improve the heat resistance and storage stability of the high impedance adhesive. The amount of the adhesive added is controlled to be about 12 wt % to about 25 wt %, preferably to be about 13 wt % to about 20 wt %. If the amount of the adhesive added is too small, the adhesion of the black matrix material to the substrate will be affected, thus leading to poor adhesion. If the amount of the adhesive added is too great, the optical density will be reduced.

For example, the acrylic resin is an acrylic polymer having an acid value of about 70 to 150 mgKOH/g and a molecular weight of about 2000 to 100000. The acrylic resin typically used in the composition for a black matrix may include dipentaerythritol hexa(meth)acrylate, dipentaerythritol penta(meth)acrylate, pentaerythritol tri(meth)acrylate, and fluorene ring-containing acrylate, or may be any combination of the above, for example, any of dipentaerythritol hexa(meth)acrylate, dipentaerythritol penta(meth)acrylate, and pentaerythritol tri(meth)acrylate is mixed with fluorene ring-containing acrylate in a mass ratio of from about 3:2 to about 9:1.

For example, the polyimide resin is typically used as a non-photosensitive resin, and it is generally obtained by imidizing at least one of an aromatic diamine or an acid dianhydride as a precursor.

For example, in order to further improve the adhesion of the composition for a black matrix, an adhesion modifier may further be added. For example, the adhesion modifier includes a silane coupling agent and a titanium coupling agent. For example, conventional adhesion modifiers include bis-3-(aminopropyl)tetramethylsiloxane, 3-aminopropyltriethoxysilane, γ-(methacryloyloxy)propyltrimethoxysilane and γ-mercaptopropyltriethoxysilane. The adhesive modifier can improve the adhesion of the black matrix to the substrate, and its content in the composition for a black matrix is controlled to be about 0.02 wt % to 0.3 wt %, for example about 0.15 wt %. If the content of the adhesion modifier is too low, the adhesion effect cannot be improved. If the content of the adhesion modifier is too high, the heat resistance of the black matrix material will be reduced.

For example, in the composition for a black matrix, the solvent comprises at least one of propylene glycol methyl ether propionate, ethylene glycol monomethyl ether acetate, 1,2-propylene glycol methyl ether acetate, ethylene glycol diethyl ether, N-methyl-2-pyrrolidone, cyclohexanone, or N,N-dimethylformamide.

For example, in the composition for a black matrix, the monomer comprises at least one of trimethylolpropane triacrylate (TMPTA), tripropylene glycol diacrylate (TPGDA), 1,6-hexanediol diacrylate (HDDA), dipentaerythritol hexaacrylate (DPHA), dipentaeritritol pentaacrylate (DPPA) or pentaerythritol triacrylate (PETA).

For example, the first dye in the present embodiment includes carmine, lemon yellow, sunset yellow and indigo. For example, the first dye have a great particle size, and can refract incident light and reduce light transmittance, thus improving the optical density. For example, the first dye may have a particle size of about 400 to 800 nm, for example, the first dye may have a particle size of about 400 nm, 450 nm, 500 nm, 550 nm, 600 nm, 650 nm, 700 nm, 750 nm or 800 nm. The first dye in the present embodiment may be a dye of a single color or may be a blend of dyes of various colors.

It shall be noted that the first dye in the present embodiment is not limited to the above-mentioned ones, and it may also be other modified dyes which are easily bonded to the monomer and can refract incident light.

For example, the content of the first dye in the present embodiment is controlled to be about 5 wt % to 10 wt %, and the content of the first dye shall be balanced with that of the monomer and the light-shielding material.

Figure 5:
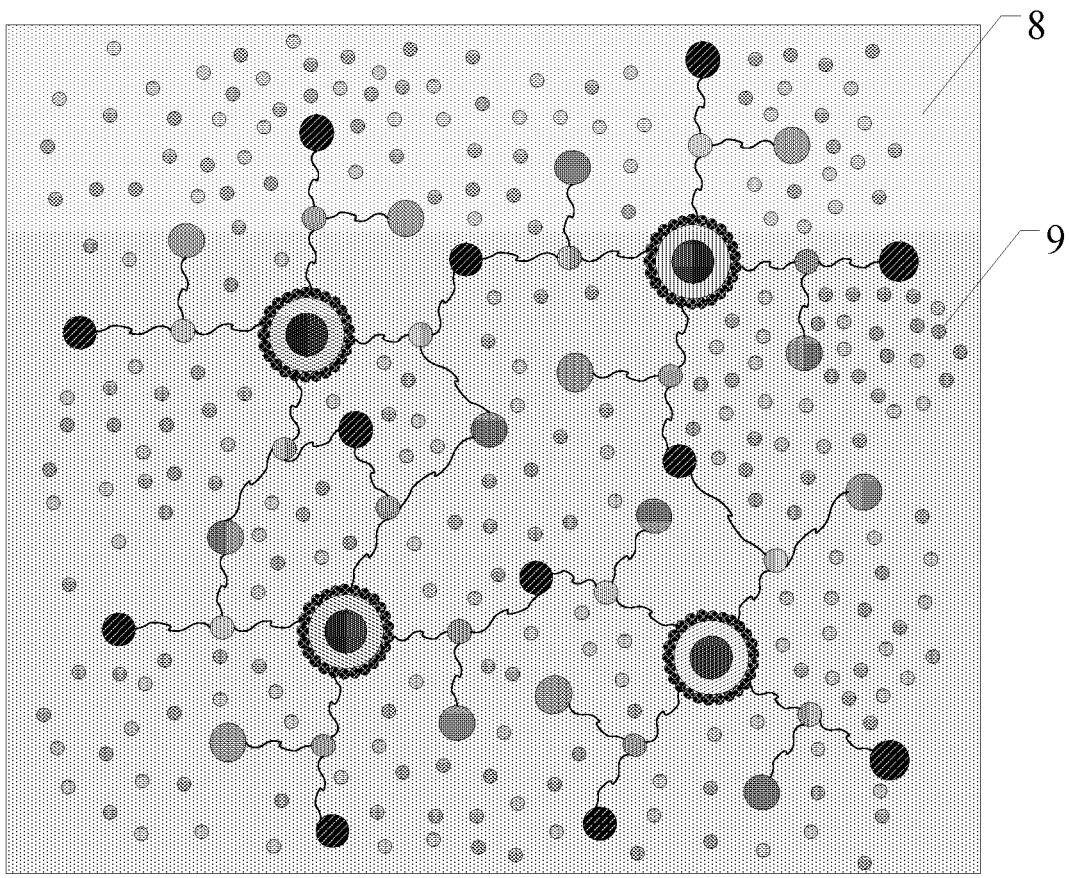
FIG. 5 shows another composition for a black matrix according to an embodiment of the present disclosure.

For example, FIG. 5 is another composition for a black matrix according to an embodiment of the present disclosure. The composition for a black matrix further comprises a second dye 9 which can further reduce light transmittance and thereby improve the optical density. The second dye 9 has a smaller size than the first dye. For example, the second dye has a particle size of about 50 to 200 nm, for example, the second dye may have a particle size of about 50 nm, 100 nm, 150 nm, or 200 nm. For example, the second dye includes azo dyes (e.g., aminoazobenzene), anthraquinone dyes (e.g., 1-nitroanthraquinone, 1-aminoanthraquinone, 1-methylamino-4-bromoanthraquinone), phthalocyanine dyes (e.g., copper phthalocyanines), polymethine dyes (e.g., heptamethine indocyanine) and sulfur dyes (e.g., dibenzothiophene).

For example, the second dye is readily soluble in the solvent of the present embodiment, and the second dye prevents light from transmission via mixing three primary colors, thereby reducing the light transmittance so as to increase the optical density.

For example, in order to improve the uniformity of the color of the second dye, the composition for a black matrix may further include a dye modifier. The dye modifier may include diamines, diols, dihalohydrocarbons and diacid chlorides. For example, diamines include ethylenediamine, butanediamine, hexamethylenediamine and octanediamine; diols include ethylene glycol, butylene glycol, hexanediol and neopentyl glycol; dihalohydrocarbons include dichlorohexane, dibromohexane and dichlorobutane; diacid chlorides include terephthaloyl chloride, m-phthaloyl chloride and o-phthaloyl chloride.

Embodiment 2

Figure 6:
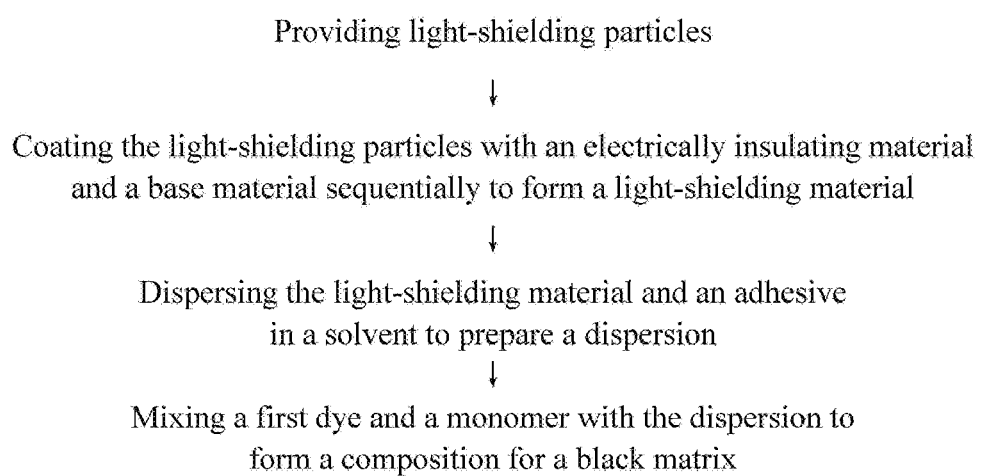
FIG. 6 is a flow chart of a method for preparing a composition for a black matrix according to an embodiment of the present disclosure.

The present embodiment provides a method for preparing a composition for a black matrix. FIG. 6 is a flow chart of a method for preparing a composition for a black matrix according to the present embodiment. The method comprises: providing light-shielding particles; coating the light-shielding particles with an electrically insulating material and a base material sequentially to form a light-shielding material; dispersing the light-shielding material and an adhesive in a solvent to prepare a dispersion; and mixing a first dye and a monomer with the dispersion to form the composition for a black matrix; wherein the adhesive, the first dye and the light-shielding material are bonded by the monomer.

For example, the above process comprises: dispersing the light-shielding material and the adhesive in a solvent and stirring for about 1 to 3 hours to prepare a dispersion, adding the dispersion to a grinding machine and dispersing at a rotational speed of about 5000 to 10,000 rpm for about 30 to 60 minutes, and then mixing the first dye and the monomer with the dispersion to form a composition for a black matrix. The black matrix material may have an optical density (OD) of up to about 2.5~5.5 and a resistivity of up to about 4.0~6.0E+14 Ω·cm. It can be used to prepare a black matrix of a liquid crystal display device.

For example, the composition for a black matrix comprises about 12 wt % to 25 wt % of the adhesive, about 20 wt % to 45 wt % of the light-shielding material, about 10 wt % to 45 wt % of the solvent, about 5 wt % to 10 wt % of the first dye, and about 5 wt % to 10 wt % of the monomer.

For example, the composition for a black matrix preferably comprises about 13 wt % to about 20 wt % of the adhesive, about 32 wt % to about 42 wt % of the light-shielding material, about 25 wt % to about 40 wt % of the solvent, about 6 wt % to about 8 wt % of the first dye, and about 6 wt % to about 8 wt % of the monomer.

For example, the composition for a black matrix may comprise about 14 wt % of the adhesive, about 34 wt % of the light-shielding material, about 38 wt % of the solvent, about 7 wt % of the first dye, and about 7 wt % of the monomer.

For example, the light-shielding particles are coated with an electrically insulating material and a base material sequentially. The light-shielding particles are coated firstly with the electrically insulating material so that each of the light-shielding particles can be fully covered with the electrically insulating material and better electrical insulation can be achieved between the light-shielding particles, thereby improving the impedance of the black matrix material. Moreover, the light-shielding particles have a smaller particle size prior to being coated with the electrically insulating material, making it easier to fully cover each of the light-shielding particles with an electrically insulating material.

For example, in the composition for a black matrix, the light-shielding particles 1 may be carbon black particles and/or titanium black particles (the main component is $TiN_xO_y$, where $0 \le x \le 2.0$, $1.0 \le y \le 2.0$, x and y being integers). Titanium black herein is also known as low valent titanium oxide or titanium oxynitride. For example, the light-shielding particles may further include other metal oxide particles such as ferroferric oxide particles and the like.

For example, the carbon black particles and the titanium black particles may have a particle size of about 200 to about 500 nm. For example, the carbon black particles and the titanium black particles may have a particle size of about 200 nm, 250 nm, 300 nm, 350 nm, 400 nm, 450 nm or 500 nm.

For example, the titanium black particles have a higher impedance than the carbon black particles. When the carbon black particles and the titanium black particles are mixed and used in the black matrix material, the impedance of the black matrix material can be controlled by adjusting the mass ratio of the carbon black particles to the titanium black particles. For example, in the mixed material formed from carbon black particles and titanium black particles, the mass of the carbon black particles is about 5% to 20% of that of the titanium black particles. For example, the titanium black particles in the present embodiment can be obtained by reacting titanium dioxide powder with ammonia at about 800 to 1000° C. for about 8 to 10 hours.

For example, in the composition for a black matrix, the electrically insulating material may be an electrically insulating organic material which includes at least one of a phenolic resin, a melamine resin, a polyester resin, an epoxy resin, a diphenyl ether resin, a silicone resin, or an organofluorine resin.

For example, when the surface of inorganic particles is coated with organics, the surface of inorganic particles can be coated uniformly and well, and the content of the organics with which the surface is coated has a great controllability.

For example, the structure formed in the present embodiment may be carbon black @ phenolic resin, carbon black @ melamine resin, carbon black @ polyester resin, carbon black @ epoxy resin, carbon black @ diphenyl ether resin, carbon black @ silicone resin, or carbon black @ organofluorine resin, etc. Or, the structure formed in the present embodiment may be titanium black @ phenolic resin, titanium black @ melamine resin, titanium black @ polyester resin, titanium black @ epoxy resin, titanium black @ diphenyl ether resin, titanium black @ silicone resin, or titanium black @ organofluorine resin, etc. It shall be noted that the structure of coating the surface of inorganic particles with organics in the present embodiment are not limited to the above, and it may also be a core-shell structure formed by carbon black/titanium black and the above various organics.

For example, the method of coating the surface of inorganic particles with organics includes a graft polymerization process, an emulsion polymerization process or an emulsion crosslinking process.

Alternatively, in the composition for a black matrix, the electrically insulating material may be an electrically insulating inorganic material. For example, the electrically insulating inorganic material includes at least one of aluminum nitride, silicon nitride, or silicon carbide.

For example, the method of coating the surface of inorganic particles with inorganics includes a seed growth method process or a solvothermal process. For example, when inorganic particles are coated with inorganics by a solvothermal process, it can be carried out in a high-pressure dynamic reaction kettle or in a high-pressure static reaction kettle.

For example, the structure of coating inorganic particles with inorganics in the present embodiment may be carbon black @ aluminum nitride, carbon black @ silicon nitride, carbon black @ silicon carbide, titanium black @ aluminum nitride, titanium black @ silicon nitride or titanium black @ silicon carbide. It shall be noted that the structure of coating the surface of inorganic particles with inorganics in the present embodiment is not limited to the above, and it may also be a core-shell structure formed by carbon black/titanium black and the above various inorganics.

For example, the light-shielding particles and the electrically insulating material forming the above core-shell structure are dissolved in a corresponding solvent, and subjected to ultrasonic dispersion. Then, some of the uniform dispersion obtained are dropped onto a copper wire having a carbon film, and dried naturally for being observed in a transmission electron microscope. It is found that the light-shielding particles are uniformly coated with an electrically insulating material.

For example, after coating the surface of the light-shielding particles with an electrically insulating material, the electrically insulating material is further coated with a base material. For example, the base material may be acrylic resin powder or polymethyl methacrylate (PMMA). The light-shielding particles coated with the electrically insulating material are mixed with acrylic resin powder or polymethyl methacrylate (PMMA), and the mixture is ground in a mortar to form a sesame ball-like structure. For example, a light-shielding material having a three-layer structure is formed by coating the surface of the electrically insulating material with acrylic resin or polymethyl methacrylate (PMMA). Obviously, the light-shielding material in the present embodiment is a composite structure formed by the light-shielding particles, the electrically insulating material and the base material.

For example, the light-shielding particles, the electrically insulating material and the base material which form the above-mentioned three-layer structure, are dissolved in a corresponding solvent and subjected to ultrasonic dispersion. Then, some of the uniform dispersion obtained are dropped onto a copper wire having a carbon film and dried naturally for being observed in a transmission electron microscope, where it is found that the light-shielding particles are uniformly coated with an electrically insulating material which is coated with a base material. Afterwards, some of the uniform dispersion obtained are dropped onto a copper wire having a carbon film and dried naturally for being observed in a scanning electron microscope, where it is found that the surface of the electrically insulating material is coated with the base material to form a sesame ball.

For example, the light-shielding particles are directly coated with an electrically insulating material, making it easier to fully coat each of the light-shielding particles with the electrically insulating material. The base material is applied on the outermost layer, making it easier to connect the light-shielding material to a monomer.

For example, the content of the light-shielding material is controlled to be about 20 wt % to about 45 wt %. If the amount of the light-shielding material added is too small, the optical density will be reduced. If the amount of the light-shielding material added is too great, the relative amount of the adhesive will be too small, which may lead to poor adhesion.

For example, in the composition for a black matrix, the adhesive comprises at least one of an acrylic resin or a polyimide resin.

For example, the adhesive chosen is an acrylic resin. Since an acrylic resin has excellent heat resistance and stability, it can improve the heat resistance and storage stability of the high impedance adhesive. The amount of the adhesive added is controlled to be about 12 wt % to 25 wt %, preferably to be about 13 wt % to 20 wt %. If the amount of the adhesive added is too small, the adhesion of the black matrix material to the substrate will be affected, thus leading to poor adhesion. If the amount of the adhesive added is too great, the optical density will be reduced.

For example, the acrylic resin is an acrylic polymer having an acid value of about 70 to 150 mgKOH/g and a molecular weight of about 2000 to 100000. The acrylic resin typically used in the composition for a black matrix may include: dipentaerythritol hexa(meth)acrylate, dipentaerythritol penta(meth)acrylate, pentaerythritol tri(meth)acrylate, and fluorene ring-containing acrylate, or may be any combination of the above, for example, any of dipentaerythritol hexa(meth)acrylate, dipentaerythritol penta(meth)acrylate, and pentaerythritol tri(meth)acrylate is mixed with fluorene ring-containing acrylate in a mass ratio of from about 3:2 to about 9:1.

For example, a polyimide resin is typically used as a non-photosensitive resin, and it is generally obtained by imidizing at least one of an aromatic diamine or an acid dianhydride as a precursor.

For example, in order to further improve the adhesion of the composition for a black matrix, an adhesion modifier may further be added. For example, the adhesion modifier comprises a silane coupling agent and a titanium coupling agent. For example, conventional adhesion modifiers include bis-3-(aminopropyl)tetramethylsiloxane, 3-aminopropyltriethoxysilane, γ-(methacryloyloxy)propyltrimethoxysilane and γ-mercaptopropyltriethoxysilane. The adhesive modifier can improve the adhesion of the black matrix to the substrate, and its content in the composition for a black matrix is controlled to be about 0.02 wt % to 0.3 wt %, for example, about 0.15 wt %. If the content of the adhesion modifier is too low, the adhesion effect cannot be improved. If the content of the adhesion modifier is too high, the heat resistance of the black matrix material will be reduced.

For example, in the composition for a black matrix, the solvent comprises at least one of propylene glycol methyl ether propionate, ethylene glycol monomethyl ether acetate, 1,2-propylene glycol methyl ether acetate, ethylene glycol diethyl ether, N-methyl-2-pyrrolidone, cyclohexanone, or N,N-dimethylformamide.

For example, in the composition for a black matrix, the monomer comprises at least one of trimethylolpropane triacrylate (TMPTA), tripropylene glycol diacrylate (TPGDA), 1,6-hexanediol diacrylate (HDDA), dipentaerythritol hexaacrylate (DPHA), dipentaeritritol pentaacrylate (DPPA) or pentaerythritol triacrylate (PETA). The monomer has a long chain and a branched chain, by which the adhesive, the first dye and the light-shielding material are bonded.

For example, the first dye in the present embodiment includes carmine, lemon yellow, sunset yellow and indigo. For example, the first dye have a great particle size; and can refract incident light and reduce light transmittance, thus improving the optical density. For example, the first dye have a particle size of about 400 to 800 nm, for example, the first dye may have a particle size of about 400 nm, 450 nm, 500 nm, 550 nm, 600 nm, 650 nm, 700 nm, 750 nm or 800 nm. The first dye in the present embodiment may be a dye of a single color or may be a blend of dyes of various colors.

It shall be noted that the first dye in the present embodiment is not limited to the above-mentioned ones, and it may also be other modified dyes which are easily bonded to the monomer and can refract incident light.

For example, the content of the first dye in the present embodiment is controlled to be about 5 wt % to 10 wt %, and the content of the first dye shall be balanced with that of the monomer and the light-shielding material.

For example, the composition for a black matrix may also comprise a second dye, which can further reduce light transmittance and thereby improves the optical density. The second dye has a smaller size than the first dye. For example, the second dye has a particle size of about 50 to 200 nm, for example, the second dye may have a particle size of about 50 nm, 100 nm, 150 nm, or 200 nm. For example, the second dye includes azo dyes (e.g., aminoazobenzene), anthraquinone dyes (e.g., 1-nitroanthraquinone, 1-aminoanthraquinone, 1-methylamino-4-bromoanthraquinone), phthalocyanine dyes (e.g., copper phthalocyanines), polymethine dyes (e.g., heptamethine indocyanine) and sulfur dyes (e.g., dibenzothiophene).

For example, in order to improve the uniformity of the color of the second dye, the composition for a black matrix may further include a dye modifier. The dye modifier may include diamines, diols, dihalohydrocarbons and diacid chlorides. For example, diamines include ethylenediamine, butanediamine, hexamethylenediamine and octanediamine; diols include ethylene glycol, butylene glycol, hexanediol and neopentyl glycol; dihalohydrocarbons include dichlorohexane, dibromohexane and dichlorobutane; diacid chlorides include terephthaloyl chloride, m-phthaloyl chloride and o-phthaloyl chloride.

Embodiment 3

The present embodiment provides a display substrate comprising a black matrix which is prepared using any of the compositions for a black matrix according to Embodiment 1. For example, the display substrate in the present embodiment further comprises a base substrate, and a color filter, an alignment film, an optical film, and a driving circuit provided on the base substrate.

For example, the display panel is a liquid crystal display panel comprising an array substrate and an opposed substrate which are assembled with each other to form a liquid crystal cell filled with a liquid crystal material. The opposed substrate is, for example, a color filter substrate. The pixel electrode of each pixel unit of the array substrate is used to control the rotation degree of the liquid crystal material by applying an electric field so as to perform a display operation.

Embodiment 4

The present embodiment provides a display device comprising the display substrate in Embodiment 3. For example, the display device may be a liquid crystal display or any product or component having a display function such as a TV set, a digital camera, a mobile phone, a watch, a tablet computer, a laptop, a navigator, or the like comprising a liquid crystal display.

Embodiments of the present disclosure provide a composition for a black matrix and a method for preparing the same, a display substrate and a display device, which have at least one of the following advantages:

(1) coating the light-shielding particles with an electrically insulating material and a base material sequentially, to achieve better electrical insulation between the light-shielding particles, where the light-shielding particles have a smaller particle size prior to being coated with the electrically insulating material, making it easier to fully coat each of the light-shielding particles with the electrically insulating material;

(2) the composition for a black matrix further comprises an adhesive, a monomer and a first dye, wherein the monomer has a long chain, widens the spacing between the light-shielding particles, and further enhances the impedance of the composition for a black matrix; the adhesive, the first dye and the light-shielding material are bonded by the monomer, thus better supporting the light-shielding material; the first dye can refract incident light and reduce light transmittance, thereby increasing the optical density.

Please note the following:

(1) The drawings of the embodiments of the present disclosure relate only to the structures involved in the embodiments of the present disclosure, and as for other structures, reference may be made to conventional designs.

(2) For clarity, the thickness of the layer or area is scaled up or scaled down in the drawings for describing the embodiments of the present disclosure, that is, the drawings are not drawn to the actual proportions. It will be appreciated that when an element, such as a layer, a film, a region or a substrate is referred to as being "above" or "below" another element, the element may be "directly" "above" or "below" another element, or there may be an intermediate element.

(3) In the absence of a conflict, the embodiments and the features in the embodiments of the present disclosure may be combined with each other to obtain new embodiments.

What are described above is related to the illustrative embodiments of the disclosure only and not limitative to the scope of the disclosure; the scopes of the disclosure are defined by the accompanying claims.

The present application claims the priority of the Chinese patent application No. 201710001229.0 submitted on Jan. 3, 2017, and the content disclosed in the above Chinese patent application is incorporated herein by reference as part of the present application.

The invention claimed is:

1. A composition for a black matrix, comprising: an adhesive, a light-shielding material, a solvent, a first dye and a monomer,
   wherein the light-shielding material comprises a light-shielding particle, an electrically insulating material, and a base material;

wherein the light-shielding particle is coated sequentially with the electrically insulating material, and the base material;
wherein the base material is acrylic resin powder or polymethyl methacrylate;
wherein, the electrically insulating material is an electrically insulating organic material which includes at least one of a phenolic resin, a melamine resin, a polyester resin, an epoxy resin, a diphenyl ether resin, a silicone resin, or an organofluorine resin; or the electrically insulating material is an electrically insulating inorganic material which includes at least one of aluminum nitride, silicon nitride, or silicon carbide;
wherein the adhesive, the first dye and the light-shielding material are bonded by the monomer;
wherein the composition comprising about 12 wt % to about 25 wt % of the adhesive, about 20 wt % to about 45 wt % of the light-shielding material, about 10 wt % to about 45 wt % of the solvent, about 5 wt % to about 10 wt % of the first dye, and about 5 wt % to about 10 wt % of the monomer, based on the composition for the black matrix; and
wherein the adhesive comprises at least one of an acrylic resin or a polyimide resin.

2. The composition according to claim 1, further comprising a second dye dissolved in the solvent.

3. The composition according to claim 1, wherein the light-shielding particle includes at least one of carbon black particles or titanium black particles.

4. The composition according to claim 1, wherein the solvent comprises at least one of propylene glycol methyl ether propionate, ethylene glycol monomethyl ether acetate, 1,2-propylene glycol methyl ether acetate, ethylene glycol diethyl ether, N-methyl-2-pyrrolidone, cyclohexanone, or N,N-dimethylformamide.

5. The composition according to claim 1, wherein the monomer comprises at least one of trimethylolpropane triacrylate (TMPTA), tripropylene glycol diacrylate (TPGDA), 1,6-hexanediol diacrylate (HDDA), dipentaerythritol hexaacrylate (DPHA), dipentaeritritol pentaacrylate (DPPA) or pentaerythritol triacrylate (PETA).

6. A display substrate comprising a black matrix, wherein the black matrix is prepared from the composition according to claim 1.

7. A display device, comprising the display substrate according to claim 6.

8. The composition according to claim 1, wherein the light-shielding particle is carbon black, and the electrically insulating material is an electrically insulating inorganic material which includes at least one of aluminum nitride, silicon nitride, or silicon carbide.

9. A method for preparing a composition for a black matrix, comprising:
providing light-shielding particles;
coating the light-shielding particles with an electrically insulating material and a base material sequentially to form a light-shielding material;
dispersing the light-shielding material and an adhesive in a solvent to prepare a dispersion; and
mixing a first dye and a monomer with the dispersion to form the composition for a black matrix;
wherein the adhesive, the first dye and the light-shielding material are bonded by the monomer; the base material is acrylic resin powder or polymethyl methacrylate; and
the electrically insulating material is an electrically insulating organic material which includes at least one of a phenolic resin, a melamine resin, a polyester resin, an epoxy resin, a diphenyl ether resin, a silicone resin, or an organofluorine resin; or the electrically insulating material is an electrically insulating inorganic material which includes at least one of aluminum nitride, silicon nitride, or silicon carbide;
wherein the composition for a black matrix comprises about 12 wt % to about 25 wt % of the adhesive, about 20 wt % to about 45 wt % of the light-shielding material, about 10 wt % to about 45 wt % of the solvent, about 5 wt % to about 10 wt % of the first dye, and about 5 wt % to about 10 wt % of the monomer; and
wherein the adhesive comprises at least one of an acrylic resin or a polyimide resin.

10. The method according to claim 9, further comprising dissolving a second dye in the solvent.

11. The method according to claim 9, wherein the light-shielding particles include at least one of carbon black particles or titanium black particles.

12. The method according to claim 9, wherein the monomer comprises at least one of trimethylolpropane triacrylate (TMPTA), tripropylene glycol diacrylate (TPGDA), 1,6-hexanediol diacrylate (HDDA), dipentaerythritol hexaacrylate (DPHA), dipentaeritritol pentaacrylate (DPPA) or pentaerythritol triacrylate (PETA).

13. The method according to claim 9, wherein the electrically insulating material is an electrically insulating organic material which includes at least one of a phenolic resin, a melamine resin, a polyester resin, an epoxy resin, a diphenyl ether resin, a silicone resin, or an organofluorine resin.

14. The method according to claim 9, wherein the electrically insulating material is an electrically insulating inorganic material which includes at least one of aluminum nitride, silicon nitride, or silicon carbide.

15. The method according to claim 9, wherein the solvent comprises at least one of propylene glycol methyl ether propionate, ethylene glycol monomethyl ether acetate, 1,2-propylene glycol methyl ether acetate, ethylene glycol diethyl ether, N-methyl-2-pyrrolidone, cyclohexanone, or N,N-dimethylformamide.

16. The method according to claim 9, wherein the light-shielding particle is carbon black, and the electrically insulating material is an electrically insulating inorganic material which includes at least one of aluminum nitride, silicon nitride, or silicon carbide.

* * * * *